(12) United States Patent
Luque

(10) Patent No.: US 6,198,497 B1
(45) Date of Patent: Mar. 6, 2001

(54) ADJUSTMENT OF A LASER DIODE OUTPUT POWER COMPENSATOR

(75) Inventor: Phillip R. Luque, Boise, ID (US)

(73) Assignee: Hewlett-Packard, Palo Alto, CA (US)

( * ) Notice: Subject to any disclaimer, the term of this patent is extended or adjusted under 35 U.S.C. 154(b) by 0 days.

(21) Appl. No.: 09/089,880

(22) Filed: Jun. 3, 1998

(51) Int. Cl.[7] .................................................. B41J 2/435

(52) U.S. Cl. .................... 347/247; 347/236; 347/237; 347/246; 347/133; 372/33; 372/38

(58) Field of Search .................................. 347/236, 237, 347/246, 247, 253, 133; 372/38, 33, 31, 34, 29; 369/54

(56) References Cited

U.S. PATENT DOCUMENTS

| 5,465,264 | * | 11/1995 | Buhler et al. | 372/31 |
| 5,764,667 | * | 6/1998 | Luque | 372/38 |
| 5,802,089 | * | 9/1998 | Link | 372/38 |
| 5,912,694 | * | 6/1999 | Miyake et al. | 347/247 |

FOREIGN PATENT DOCUMENTS

| 376555 | 7/1990 | (EP) . |
| 0546591 | 4/1993 | (EP) . |
| 63086590 | 4/1988 | (JP) . |
| 4835781 | 5/1989 | (JP) . |
| 3169156 | 7/1991 | (JP) . |
| 8072298 | 3/1996 | (JP) . |
| 93266341 | 10/1997 | (JP) . |
| 10119350 | 5/1998 | (JP) . |

* cited by examiner

Primary Examiner—N. Le
Assistant Examiner—Hai C. Pham
(74) Attorney, Agent, or Firm—Gregg W. Wisdom

(57) ABSTRACT

A first embodiment of an adjustment circuit for a laser diode output power compensator includes a feedback circuit for adjusting the laser diode output power compensator so that the output power of the laser diode is substantially constant. The feedback circuit includes a photodiode for measuring the output power of a VCSEL diode. The signal from the photodiode is coupled to a first amplifier. The difference between the signal from the photodiode and a first reference value is amplified and coupled through electronic switches to selectively charge one of multiple capacitors. The multiple capacitors are each coupled to one of a drive current source, a compensation current source, and a voltage controlled resistor, each of which are voltage controlled. A second amplifier is used for amplifying the difference between the signal from the photodiode and a second reference value to charge a capacitor coupled to a voltage controlled bias current source. The first embodiment of the adjustment circuit controls the bias current source, drive current source, compensation current source, and the voltage controlled resistor so that the output power of the VCSEL diode is held substantially constant. A second embodiment of the adjustment circuit uses an analog to digital converter, a digital comparator, a counter, and registers to form the feedback circuit for adjusting the laser diode output power compensator. A third embodiment of the adjustment circuit uses an analog comparator, counters, and registers to form the feedback circuit for adjusting the laser diode output power compensator.

21 Claims, 10 Drawing Sheets

100 ns/div 50.0 ns/div

ADJUSTMENT OF A LASER DIODE OUTPUT POWER COMPENSATOR

CROSS REFERENCE TO RELATED APPLICATIONS

This application includes subject matter related to the co-pending application entitled COMPENSATION FOR LASER DIODE OUTPUT POWER VARIATION, application of Ser. No. 08/707,833, filed Nov. 12. 1996 and the application entitled CURRENT STEERING CIRCUIT, application of Ser. No. 08/762,463, filed Dec. 9, 1996, now U.S. Pat. No. 5,764,667, each of which are incorporated by reference herein.

FIELD OF THE INVENTION

This invention relates generally to the controlling the output power of a laser diode and, more specifically, to automatically compensating for output power variations in vertical cavity surface emitting diodes.

BACKGROUND OF THE INVENTION

A laser diode is a semiconductor device which emits laser light as a result of applying a forward current in excess of a threshold value. The physical structure of an edge emitting laser diode typically includes an active layer located between N type and P type layers. The ends of the active area not bounded by the N type and P type layers are each covered by a mirror facet. The laser light is generated in the active layer. The mirror facets at the ends of the active area form an optical resonator. Light generated in the active area which does not propagate parallel to the axis of the optical resonator leaves the active area through the sides of the resonator. Light traveling in the optical resonator parallel to its axis is repeatedly reflected from the mirror facets.

Light is generated in the active area through processes of spontaneous emission and stimulated emission. In the process of spontaneous emission an electron moves from a state in the conduction band to a state in the valence band within the active layer. The energy lost by the electron is converted to a photon. Spontaneous emission occurs so that photons are generated at random in time and propagate in all directions within the active layer. Because of this, spontaneous emission does not generate a coherent beam of laser light. In the process of stimulated emission, a photon transfers its energy to an electron in the conduction band. When the energized electron moves to a lower energy state in the valence band it emits two photons which propagate in the direction of the incident photon.

Without a forward current above the threshold value applied to the laser diode, the distribution of energies of the electrons in the active layer is such that spontaneous emission dominates the light generation process. No light amplification occurs because there is not a sufficient fraction of the population of electrons existing in conduction band energy states to allow stimulated emission to occur to the degree that it will replace those photons lost from the active layer.

However, when a forward current above the threshold value flows through the active layer, the energy states of a large fraction of the electrons are shifted into the conduction band. As a result, stimulated emission dominates the light generation process. Photons which leave the active area are outnumbered by those which are reflected from the mirror facets. The photons reflected from the mirror facets cause light amplification through the stimulated emission process. When stimulated emission dominates the light generation process oscillation occurs in the resonator.

Photons generated by stimulated emission from photons reflected from the mirror facets propagate parallel to the optical axis of the resonator and either cause stimulated emission of additional photons or are reflected from the mirror facets. As a result, generation of light propagating parallel to the optical axis is favored. As the forward current flowing through the active layer increases, the fraction of the population of electrons in the conduction band increases causing a corresponding increase in the generated laser light. The length of the active region between the mirror facets is an integral multiple of the half wavelength of the laser light in the active layer. The oscillation of the laser light in the resonator establishes a standing wave along the length of the active layer. A portion of the generated laser light is transmitted through the mirror facets to form the cone of light output from the laser diode.

For laser diode currents above the threshold value and below the typical maximum operating currents, the output power is approximately linearly related to the magnitude of the drive current. The drive circuits used in the commercial application of laser diodes are typically designed to rapidly switch the laser diode between the condition in which the laser diode is emitting laser light and the condition in which the optical output power is substantially zero. Generally, this is accomplished by steering a current of substantially constant value through the laser diode in response to a drive signal in the asserted state. When the drive signal is not asserted the current is bypassed around the laser diode. The intent of driving the laser diode with a current of substantially constant value is to maintain the optical output power at a substantially constant value over the time in which drive current is flowing through the laser diode.

A vertical cavity surface emitting laser (VCSEL) diode operates by the same physical principles as an edge emitting laser diode using a different physical configuration. In a VCSEL diode, a series of layers of a dielectric material are located above and below the active layer. The dielectric constants of these layers are selected so that a small percentage (in the range of 3%) of the generated light propagating normal to the layers is reflected from the interface between the active layer and the adjacent dielectric layer and between each of the dielectric layers. A portion of this generated light is transmitted through the dielectric layers and is emitted normal to the surface of the VCSEL diode. The volume of the active layer in a VCSEL diode is considerably less than that of a edge emitting diode having comparable optical output power. There are anomalies in the operating characteristics of VCSEL diodes which, for some applications, must be corrected to make the use of the VCSEL diode suitable.

SUMMARY OF THE INVENTION

Accordingly, a circuit has been developed to adjust an output power compensator for a laser diode. The output power compensator includes a plurality of electrically controlled elements, such as a voltage or current controlled bias current source, a voltage or current controlled drive current source, voltage or current controlled compensation current source, or a voltage or current controlled resistor, for controlling the laser diode output power. The circuit includes a light power measurement device for measuring the laser diode output power to generate an output signal. The circuit further includes a difference generator arranged for receiving the output signal and a plurality of predetermined values to generate a plurality of control signals. The circuit further includes a plurality of storage elements for storing the plurality of control signals. The plurality of storage elements are coupled to the difference generator with the plurality of electrically controlled elements arranged for receiving the plurality of control signals from the plurality of storage elements. The circuit operates to adjust the electrically controlled elements so that the output power of the laser diode remains substantially constant as pulses of varying widths and duty cycles are applied to the laser diode.

An electrophotographic printing system includes a photoconductor and a laser diode for exposing the photoconductor. The electrophotographic printing system further includes a laser diode output power compensator coupled to the laser diode and including a plurality of electrically controlled elements. The electrophotographic printing system further includes an adjustment circuit coupled to the laser diode output power compensator for automatically adjusting the laser diode output power compensator to compensate for variations in output power of the laser diode.

A photoconductor exposure system includes a laser diode output power compensator coupled to a laser diode. The laser diode output power compensator includes a plurality of electrically controlled elements. The photoconductor exposure system further includes an adjustment circuit coupled to the laser diode output power compensator. The adjustment circuit includes a light power measurement device for generating an output signal and a difference generator arranged for receiving the output signal and a plurality of predetermined values to generate a plurality of control signals. The adjustment circuit further includes a plurality of storage elements for storing the plurality of control signals. The plurality of storage elements are coupled to the difference generator. The plurality of electrically controlled elements are arranged for receiving the plurality of control signals from the plurality of storage elements. A method for adjusting the adjustment circuit includes a step of applying a first one of the plurality of predetermined values to the difference generator. The method further includes the step of generating a first one of the plurality of control signals using the difference generator. The method further includes the step of adjusting the first one of the plurality of control signals so the output signal substantially equals the first one of the plurality of predetermined values thereby adjusting the corresponding one of the electrically controlled elements.

DESCRIPTION OF THE DRAWINGS

A more thorough understanding of the invention may be had from the consideration of the following detailed description taken in conjunction with the accompanying drawings in which.

DETAILED DESCRIPTION OF THE DRAWINGS

VCSEL diodes can be fabricated so that multiple laser diodes are contained on a single die. This characteristic makes VCSEL diodes useful for laser printers which expose multiple lines on the photoconductor drum with a single scan of the rotating scanning mirror. By exposing multiple lines with a single scan, greater printing speed or, alternatively, greater resolution may be obtained without requiring an increase in the rotation rate of the scanning mirror. In addition, VCSEL diodes have the potential for manufacturing with higher process yields than edge emitting laser diodes, thereby lowering the cost. Although the description of the preferred embodiment of the laser diode output power compensator will be explained in the context of the application of a VCSEL diode in a laser printer, one of ordinary skill in the art will recognize, from the disclosure contained herein, that the disclosed embodiments of the laser diode output power compensator may be used for any laser diode applications in which compensation for bounded exponential rise or decay of output power variations is required. Furthermore, the teaching disclosed herein would allow one of ordinary skill in the art to make and use laser diode output power compensators for laser diodes which have an output power variations characterized by a wide variety of wave shapes.

Figure 1:
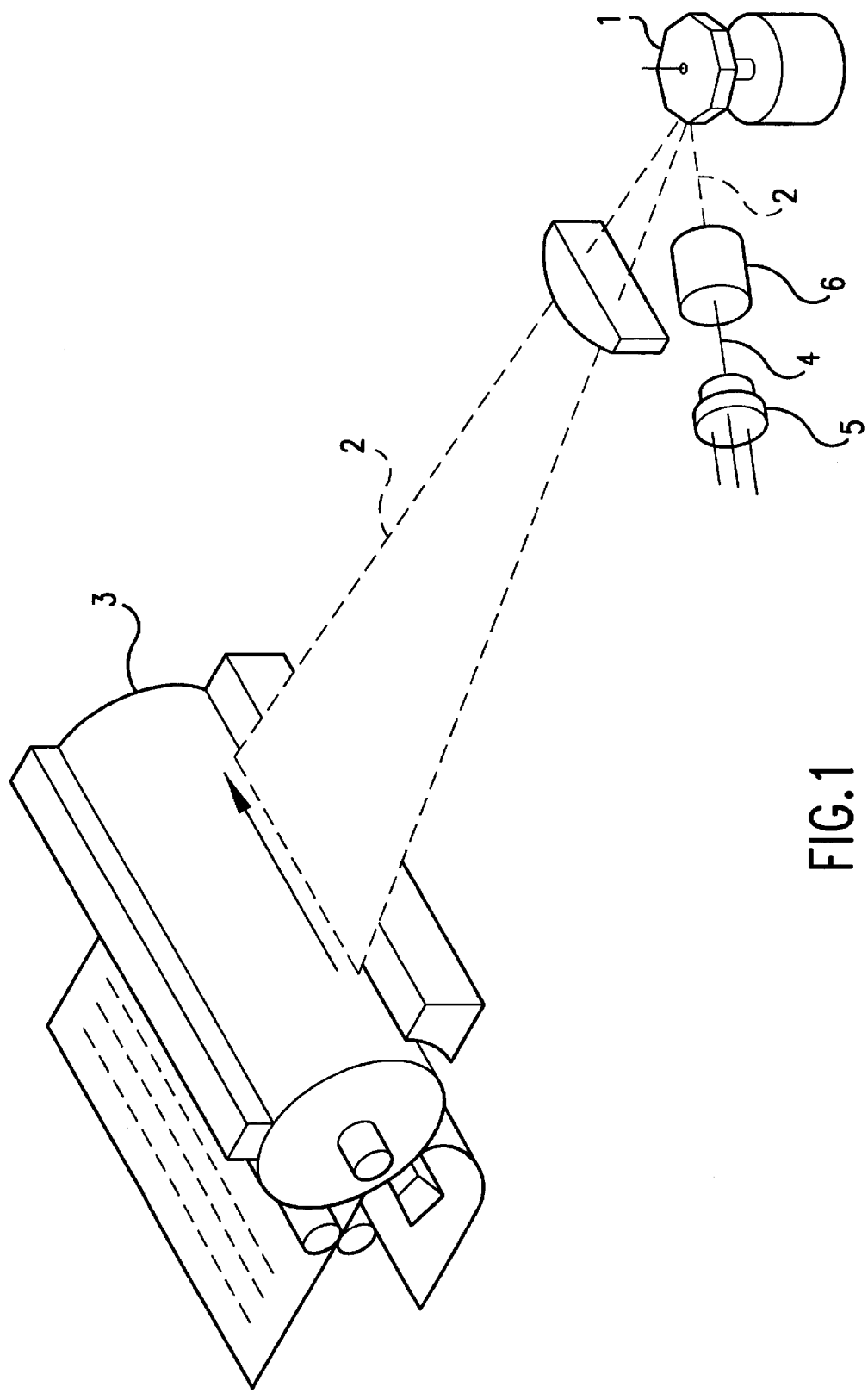
FIG. 1 is a simplified representation of the basic elements of the exposure system in an electrophotographic printer.

Shown in FIG. 1 is a simplified diagram of the layout of the photoconductor drum exposure system in a laser printer. The drum exposure system of a laser printer shown in FIG. 1 is well known by those of ordinary skill in the art of electrophotographic printer design and so will be discussed in only a rudimentary manner. Further information regarding photoconductor drum exposure systems can be found in "The Physics and Technology of Xerographic Processes", by Edgar M. Williams, 1984, a Wiley-Interscience Publication of John Wiley & Sons, the disclosure of which is hereby incorporated by reference. Rotating scanning mirror 1 sweeps a laser beam 2 across the width of a photoconductor drum 3. The laser beam 2 is pulsed to selectively expose the surface of the photoconductor drum 3 in a line by line manner as the photoconductor drum 3 rotates thereby creating a latent electrostatic image onto which toner is developed. One of ordinary skill in the art will recognize that the basic layout shown in FIG. 1 is compatible with a laser exposure system which uses multiple laser beams concurrently propagating in parallel through a single set of optics to expose areas on the surface of photoconductor drum 3.

A switching circuit drives the laser source, typically a laser diode, to control the pulsing of the laser beam 2. The smallest area on the surface of the photoconductor drum 3 which can be typically exposed forms a pixel element. However, there are laser modulation techniques that can expose sub-pixel areas on the surface of photoconductor drum 3. The printing resolution is limited by the size of the pixel element. High resolution printing requires rapid switching of the laser diode from the off state to the on state and the on state to the off state to create the smallest possible pixel element. A portion of the cone of light 4 emitted from laser diode 5 is passed through collimating lens 6 to form laser beam 2. The cross sectional profile of the laser beam 2 focused on the surface of photoconductor drum 3 is gaussian in both the horizontal and vertical dimensions of the beam width. To ensure uniform development of the latent electrostatic image, it is important to maintain uniformity of the surface voltage of the photoconductor drum in the exposed areas. To achieve the necessary degree of surface voltage uniformity, it is necessary to tightly control the sensitivity of the photoconductor drum 3 and the power of the laser beam 2 across the length of the photoconductor drum 3.

Figure 2:
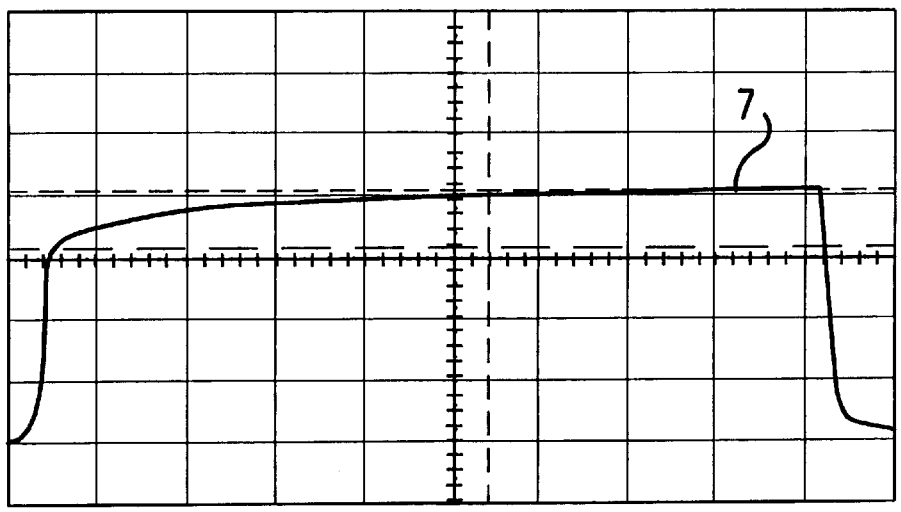
FIG. 2 is a plot of the measured optical output power over time of a vertical cavity surface emitting laser diode in response to a substantially constant amplitude pulse of current applied.
Figure 3:
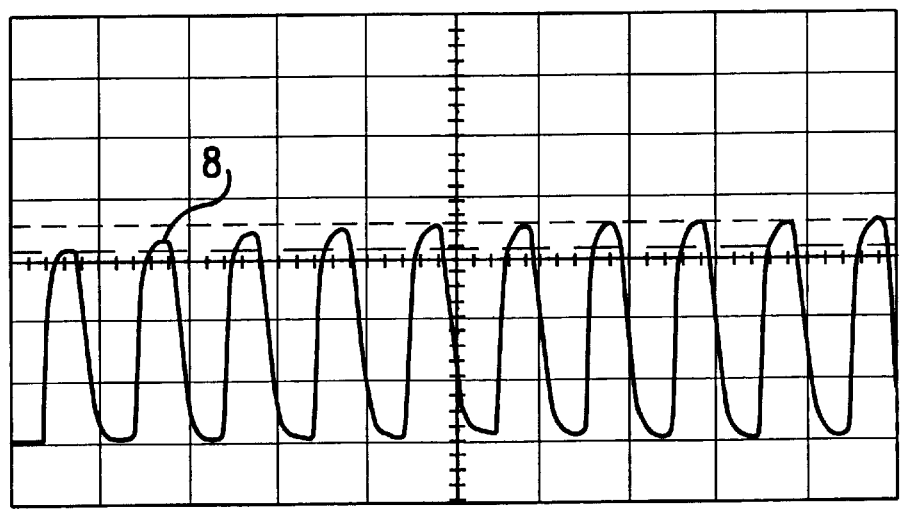
FIG. 3 is a plot of the measured optical output power over time of a vertical cavity surface emitting laser diode in response to the application of square wave current pulses of constant amplitude.

VCSEL diodes have a performance characteristic which, if left uncorrected, limit their usefulness for applications in which only relatively small variations in laser diode output power can be tolerated. A constant current pulse above the threshold level applied to the VCSEL diode at $t=t_0$ causes emission of a cone of light at $t=t_1$. This cone of light has an initial diameter and an initial power. As time elapses after $t_1$, the power of the cone of light increases and the diameter decreases. It should be noted that it is possible certain VCSEL diodes have the characteristic that the power output decreases in response to the application of a constant current pulse above the threshold level. The output power decrease can be substantially compensated for using the same design techniques disclosed for substantially compensating for the VCSEL diode output power increase. To compensate for a decrease in VCSEL diode output power, a compensating current source for generating an increasing current over time could be used. Referring to FIG. 2, shown is the measured power 7 of the cone of light (using a measurement device which measured the power output across the entire diameter of the cone of light) over time in response to a current pulse of 900 nano-seconds duration. Over the period of time for which the current pulse was applied, the power of the cone of light increased following an exponential rise time curve. The power increase of the VCSEL diode optical output was approximately 29% with a 140 nano-second time constant. Shown in FIG. 3 is the measured power 8 of the cone of light with ten successive 50% duty cycle current pulses applied. Over the time period for which the pulses where applied, the VCSEL diode optical output power increased approximately 14% with approximately the same time constant as the curve 7 of the measured VCSEL diode optical output power in FIG. 2.

Although the exact physical mechanism which causes this power output change has not yet been determined, it is suspected that it is related to the heating of the active layer from current flow through the VCSEL diode. The VCSEL diode behavior illustrated by the curves of FIG. 2 and FIG. 3 are consistent with this hypothesis. The VCSEL diode optical output power curves 7, 8 of FIG. 2 and FIG. 3 have approximately the same time constants even though for curve 7 current was continuously applied and for curve 8 50% duty cycle pulses of current where applied for the approximately the same length of time. This indicates that the mechanism causing the variation in VCSEL diode output power experiences an exponential decay as well as an exponential rise. Additionally, because the measured time constants for the VCSEL diode optical output powers shown in FIG. 2 and FIG. 3 are approximately the same, this indicates that the underlying physical effect in the VCSEL diode which causes the change in VCSEL diode output power over time can be modeled linearly using a single time constant for both the exponential rise time curve and the exponential decay time curve.

Figure 4:
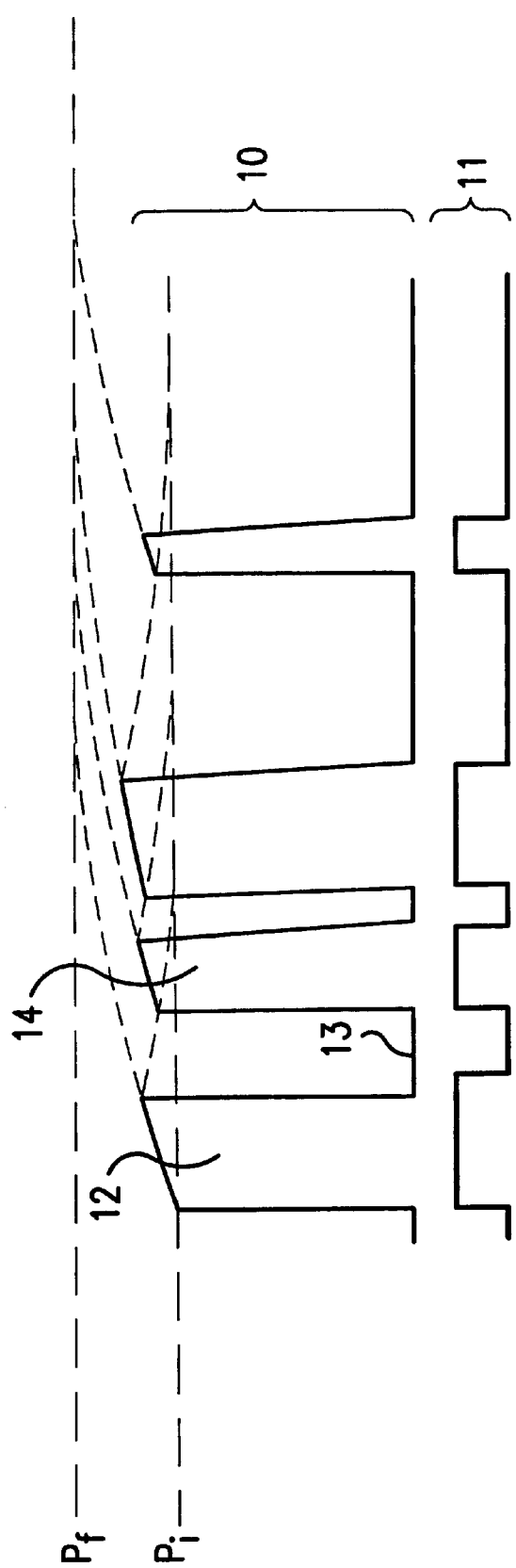
FIG. 4 is an analytically generated plot of the optical output power over time of a vertical cavity surface emitting laser diode in response to a drive signal of varying pulse width. Also shown is the drive signal used to generate the plot of the optical output power.

Shown in FIG. 4 is a plot of a generalized VCSEL diode output power curve 10 analytically generated for the corresponding binary VCSEL diode current drive signal 11. For all the time during which the current drive signal 11 is at a high level the output power of the VCSEL diode is between an initial power ($P_i$) and a final power ($P_f$). The initial power is the level of VCSEL diode output power at the time when a current pulse is first applied after the forward current through the VCSEL diode has been zero for a period of at least five time constants of the underlying physical effect. The final power is the level of VCSEL diode output power at the time after forward current has been applied for a period of at least five time constants of the underlying physical effects. The exponential rise and exponential decay of the underlying effect gives rise to the initial and final values of each of the output pulses of the VCSEL diode output power curve 10. For example, from the start to the end of the first VCSEL diode pulse 12 of output power curve 10, the output power increase follows an exponential rise time curve. Then, during the time period immediately following the first pulse 12, a time during which the output of the VCSEL is zero 13, an exponential decay of the underlying effect occurs so that the initial power of the second VCSEL diode pulse 14 has a different initial power output. The initial and final powers associated with subsequent pulses are determined in a similar fashion. The dashed lines continuing from each of the pulses show the change in the output power of the VCSEL diode over time, had the pulse not ended, and the exponential decay of the underlying effect, had the end of one pulse not been followed by the beginning of another.

The output power of the VCSEL diode at the beginning of a pulse can be determined from the output power at the end of the previous pulse. Let $P_n$ represent the power output of the VCSEL diode at time $t_n$, the beginning of a pulse. Let $P_{n-1}$ represent the power output of the VCSEL diode at time $t_{n-1}$ the end of the previous pulse. Let T represent the time constant of the underlying physical effect which results in the VCSEL diode output power variation over time. Then the output power $P_n$ at $t_n$ can be determined by:

$$P_n = P_{n-1} + (P_f - P_{n-1})(1 - e^{-[(t_n - t_{n-1})/T]}) \text{tm equation 1}$$

In a similar manner, the output power $P_{n+1}$ at time $t_{n+1}$, the end of the pulse can be determined by:

$$P_{n+1} = P_n + (P_f - P_n)(1 - e^{-[(t_{n+1} - t_n)/T]}) \qquad \text{equation 2}$$

By replacing $t_{n+1}$ with t, equation 2 can be generalized to express the output power of the VCSEL diode for $t_t \le t \ge t_{n+1}$.

Figure 5:
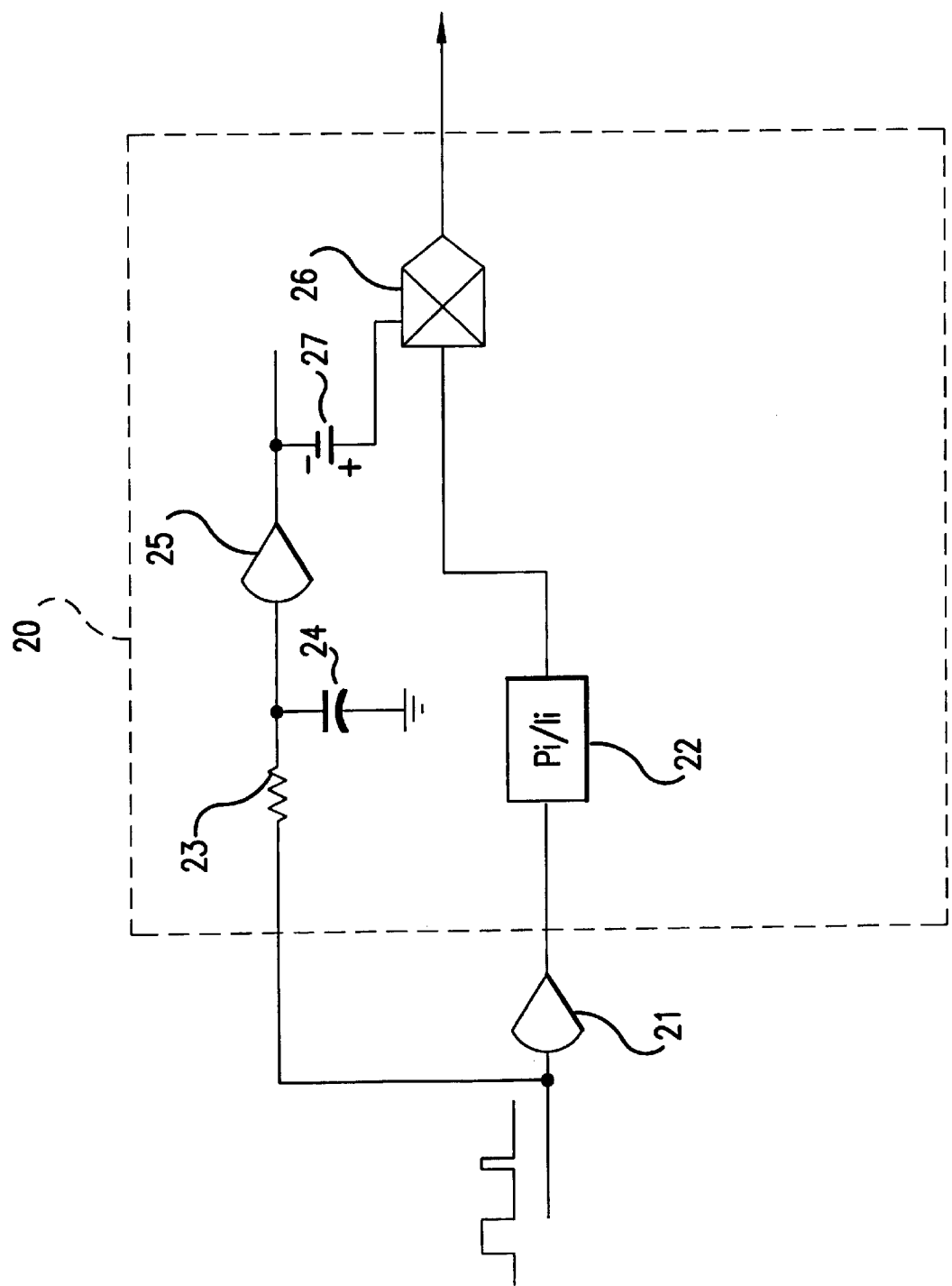
FIG. 5 is a simplified mathematical model of a vertical cavity surface emitting laser diode which accounts for the optical output power variation characteristic.

Shown in FIG. 5 is a model which represents the operating characteristics of the VCSEL diode 20 which result in the increase in the output power over the time during which a current pulse is applied. It should be emphasized that the diagram of FIG. 5 is for mathematical modeling purposes only and does not directly represent the underlying physical processes which cause the VCSEL diode 20 output power to change over time. Drive circuit 21 generates a VCSEL drive current in response to a binary input signal. The binary input signal is formed from a series of pulses of varying duration. In a laser printer, the binary signal represents the data stream of pixel elements which form the printed page and is referred to as the video signal. The video signal is synchronized with the position of the scanning mirror 1 to pulse the laser beam 2 as the scanning mirror 1 sweeps the focal point of the laser beam 2 across the photoconductor 3. For a laser printer which uses discharge area development, power is output from the VCSEL diode when the focal point of the laser beam 2 is positioned at locations on the photoconductor drum for which toner development is desired. The drive current from drive circuit 21 is converted to output power by multiplication of the drive current by the initial diode gain value ($P_i/I_i$) shown in block 22.

The output power variation characteristic of the VCSEL is modeled by the series connection of resistor 23 and capacitor 24. The values for resistor 23 and capacitor 24 are selected so that the resulting RC time constant matches the measured time constant of the output power of the VCSEL diode 20. The generalized expression for the VCSEL 20 power output during a pulse in which the beginning power is $P_n$ is:

$$P = P_n + (P_f - P_n)(1 - \epsilon^{-[(t-t_n)/T]}) \qquad \text{equation 3}$$

The video signal is connected to resistor 23 and drives the RC circuit. When the video signal is at a logic high level, capacitor 24 is charging through resistor 23. When the video signal is at a logic low level, capacitor 24 is discharging through resistor 23. In general, at time $t_n$, the beginning of an output power pulse, a voltage is present on capacitor 24. The voltage on capacitor 24 is scaled in amplifier 25 by a scale factor of K. The resulting scaled voltage is level shifted by the addition of a DC value 27 of 1 volt and then multiplied in multiplier 26 to produce the VCSEL diode output power of equation 3. The product of the resistance R of resistor 23 and the capacitance C of capacitor 24 is selected to equal T, the time constant of the exponential rise and fall time of the VCSEL diode 20 output power. The value of K necessary to produce an output power which matches that of VCSEL diode 20 is determined by setting the expression for the output power of equation 3 equal to the expression for the output power determined from the block diagram of FIG. 5. The value of K so determined is $(P_f - P_i)/P_i$. When the video signal is at a logic low level there is no output current from the drive circuit and the output of multiplier 26 is zero.

By adjusting the drive current to the VCSEL diode 20 in a way that offsets the change in the voltage across capacitor 24, the effect of the increase in the VCSEL diode 20 power output over time can be nulled. Because the output power of the VCSEL diode 20 changes linearly with the forward current, this could be accomplished by driving the VCSEL diode 20 with a current having a wave shape which is the level shifted inverse of the VCSEL diode 20 output power waveshape.

In the patent application entitled COMPENSATION FOR LASER DIODE OUTPUT POWER VARIATION, several embodiments of a laser diode output power compensator were disclosed. The disclosed circuits held the output power from the VCSEL diode substantially constant. The term "substantially constant" as it is used within this specification means a variation in VCSEL diode output power over a 5% range. Each of the disclosed circuits required multiple adjustments in order to effectively null the variations in the VCSEL output power. These adjustments include the RC time constant used to match the VCSEL characteristic, the gain of the transconductance amplifier, the VCSEL bias current and the VCSEL drive current. The necessity of making multiple adjustments on the laser diode output power compensator increases the manufacturing costs, particularly for high volume production. The embodiments of the laser diode output power compensator disclosed in this application overcome this limitation.

Figure 6:
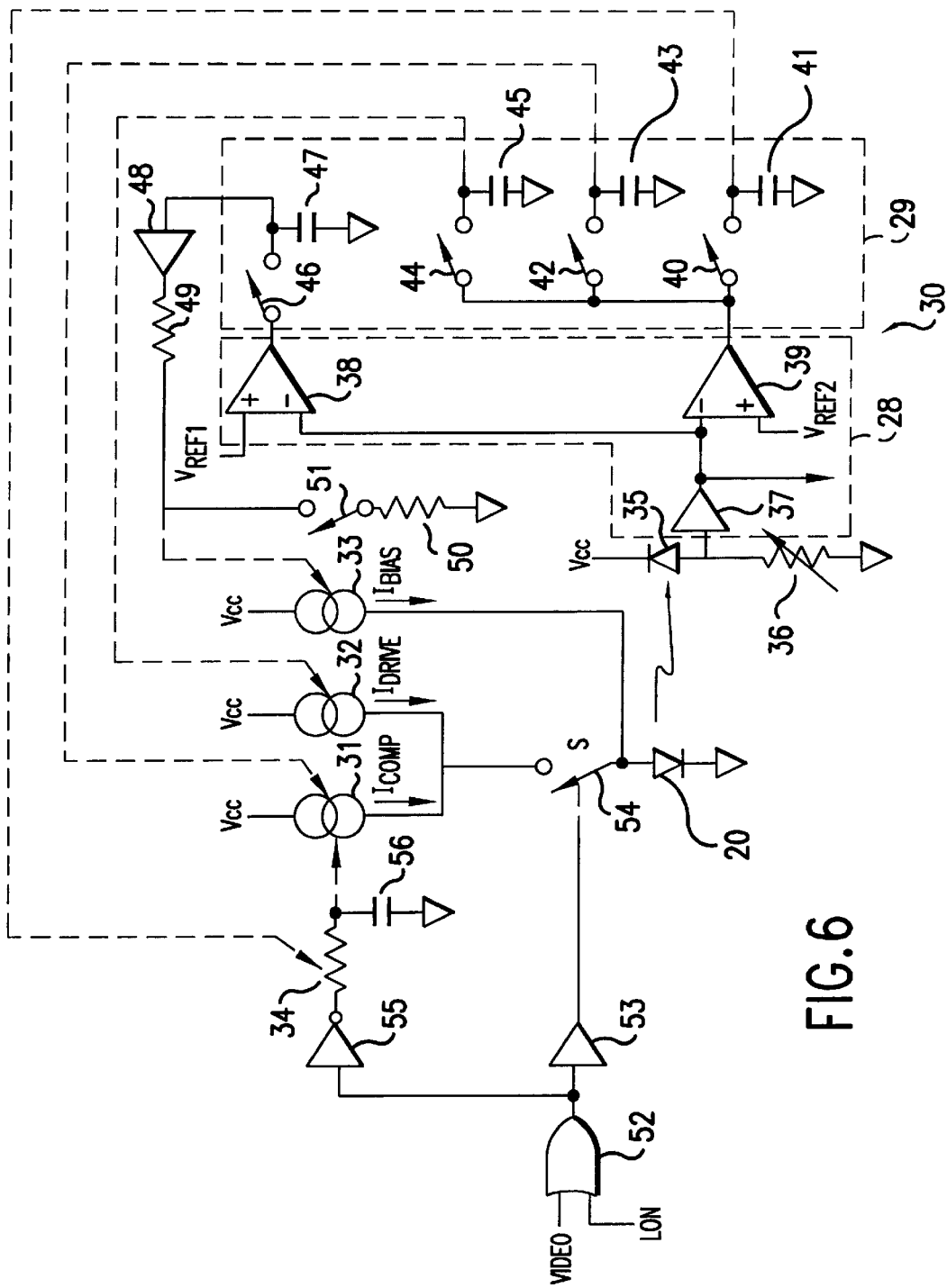
FIG. 6 is a simplified schematic of the first embodiment of an adjustment circuit.

Shown in FIG. 6 is a first embodiment of an adjustment circuit 30 for a laser diode output power compensator that requires only a single manual adjustment of a resistance value. The particular resistance value requiring adjustment is that associated with a photodiode used to measure laser diode output power. This particular adjustment is currently required on electrophotographic printers using conventional laser diodes. The portion of the circuit shown in FIG. 6 which performs the compensation for variation in the laser diode power is not shown in detail because it is not necessary for illustrating the operation of the first adjustment circuit embodiment 30.

The first adjustment circuit embodiment 30 shown in FIG. 6 is illustrated for the case in which automatic adjustment is performed on the laser diode output power compensators for a single VCSEL diode 20. The parts of the laser diode output power compensator of FIG. 6 requiring adjustment include a compensating current source 31, a drive current source 32, a bias current source 33, and a time constant resistor 34. The values of each of the current sources 31, 32, 33 and the time constant resistor 34 are controlled by voltages supplied by first adjustment circuit 30 embodiment. As shown in FIG. 6 compensating current source 31 has two inputs which control the current it generates. The current generated by compensating current source 31 is proportional to the product of the signals at the two inputs. Alternatively, compensating current source 31 could be implemented using an output from an analog multiplier which generates a product of the two signals connected to the two inputs of the compensating current source 31 shown in FIG. 6.

A light power measuring device, such as a photodetector or photodiode 35 monitors the output of VCSEL diode 20 during the calibration of the VCSEL diode 20. First resistor 36 is coupled to the anode of photodiode 35. The current generated by the incidence of the laser light on photodiode 35 flows through resistor 36. The common node formed from the connection of first resistor 36 and the anode of photodiode 35 is connected to the input of first unity gain buffer 37. The output of first unity gain buffer 37 is coupled to the inverting input of first amplifier 38 and the inverting input of second amplifier 39. The non-inverting input of first amplifier 38 is coupled to a first reference voltage and the non-inverting input of second amplifier 39 is coupled to a second reference voltage.

In FIG. 6, first unity gain buffer 37, first amplifier 38 and second amplifier 39 form a difference generator 28. Difference generator 28 takes the output signal generated by photodiode 35 as a result of measuring the light power output of VCSEL diode 20 and generates a plurality of control signals using. VCSEL diode 20 generates a range of light power output in response to controlling compensating current source 31, drive current source 32 and bias current source 33 to cause various magnitudes of current to flow through VCSEL diode 20.

The output of second amplifier 39 is coupled through a first switch 40 to first capacitor 41, through second switch 42 to second capacitor 43, and through third switch 44 to third capacitor 45. The output of first amplifier 38 is coupled through fourth switch 46 to fourth capacitor 47. In FIG. 6, switches 40, 42, 44, and 46 and capacitors 41, 43, 45, and 47 form a plurality of storage elements 29 for storing the plurality of control signals generated by the difference generator. The input of second unity gain buffer 48 is coupled to fourth capacitor 47. The output of second unity gain buffer 48 is coupled to a resistor divider formed from second resistor 49 and third resistor 50 coupled through fifth switch 51. The combination of second resistor 49, third resistor 50, and fifth switch 51 forms a controllable attenuator. The controllable attenuator allows selective attenuation of the output of second unit gain buffer 48 using fifth switch 51. The common node formed by the series connection of second resistor 49 and fifth switch 51 is coupled to the voltage control input of bias current source 33. The non-ground connected side of each of the first 41, second 43, and third 45 capacitors is coupled to, respectively, the voltage control input of time constant resistor 34, compensating current source 31, drive current source 32, and bias current source 33.

The "video" signal and the "LON" signal shown in FIG. 6 control the flow of current to VCSEL diode 20. The video signal is the stream of binary print data used for generating the pulses of laser light to expose the photoconductor. The video signal is only applied while binary data is sent to the VCSEL diode 20 for photoconductor exposure. During the adjustment process the video signal is not present. The LON signal is used to control the current supplied to VCSEL diode 20 for the adjustment process during the time laser beam 2 is not directed at photoconductor drum 3. The video signal and the LON signal are applied through OR gate 52. The input of third digital buffer 53 is coupled to the output of OR gate 52. The output of third digital buffer 53 controls sixth switch 54. Sixth switch 54 controls the application of current to VCSEL diode 20.

First 40, second 42, third 44, fourth 46, fifth 51, and sixth switch 54 are electronic switches. Electronic switches are used because of their high speed switching capability. It should be recognized that, depending upon the switching speed required for the electrophotographic printing system, switches having slower (such as an electromechanical switch) or faster switching speeds may be used.

With the addition of the necessary switching hardware, the first adjustment circuit 30 embodiment, as well as the successive embodiments may be adapted for performing adjustment of multiple VCSEL diodes in an electrophotographic printing system. Furthermore, an implementation of an adjustment circuit which performed the adjustment of multiple VCSEL diodes could be implemented without requiring duplication of photodiode 35, first resistor 36, first unity gain buffer 37, first amplifier 38, and second amplifier 39.

Figure 7:
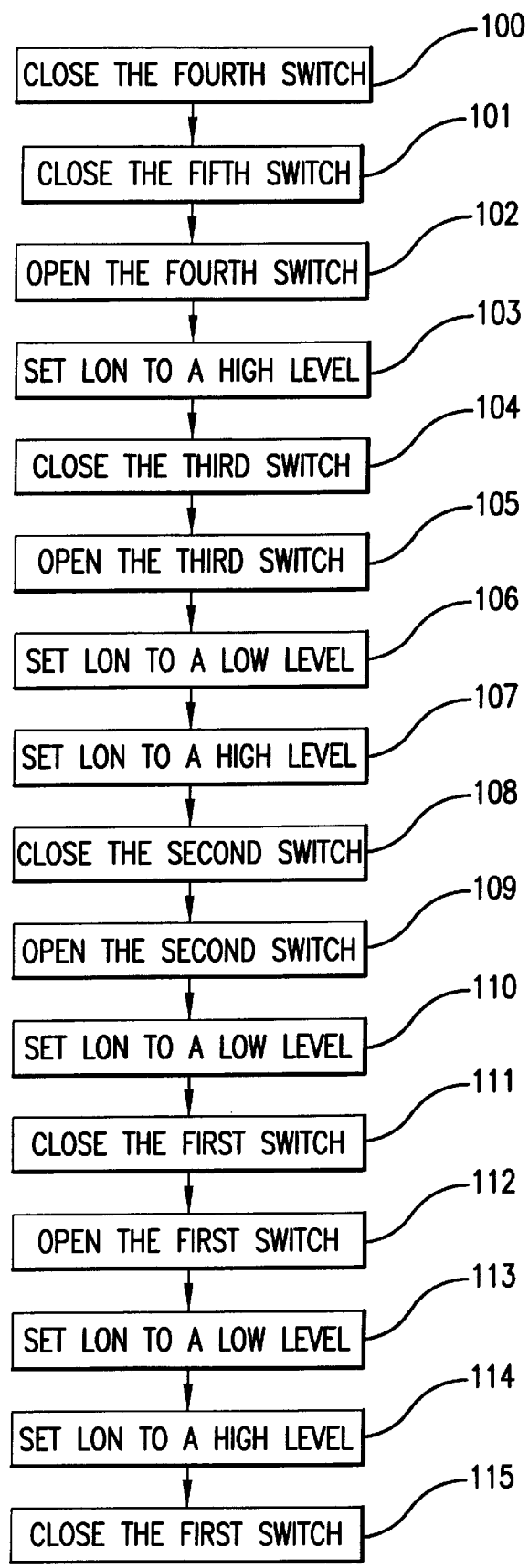
FIG. 7 is a simplified flow chart of a method for using the first embodiment of the adjustment circuit.

Shown in FIG. 7 is a flow chart of a method for using the first adjustment circuit 30 embodiment of FIG. 6 to compensate for the output power variation characteristics of VCSEL diode 20. The calibration performed using the first adjustment circuit 30 embodiment performs the adjustments in succession on the bias current source 33, the drive current source 32, the compensating current source 31, and the time constant resistor 34. During the adjustment of the bias current source 33, the LON signal is held at a low level so that sixth switch 54 remains open. With sixth switch 54 open, the only current flowing through VCSEL diode 20 is from bias current source 33. First, fourth switch 46 is closed 100 to begin the adjustment of bias current source 33. The light output of VCSEL diode 20 resulting from the flow of bias current source 33 impinges on photodiode 20 causing current to flow through first resistor 36. First unity gain buffer 37 couples the signal derived from photodetector 35 to the inverting input of first amplifier 38. First amplifier 38 generates an output which is the product of the gain of the first amplifier 38 and the difference between the signals at the inverting and the non-inverting input. First amplifier 38 charges fourth capacitor 47. During the adjustment of bias current source 33, fifth switch 51 is left open. Therefore, the voltage supplied to the bias current source 33 is the output of second buffer 48 unattenuated by the controllable attenuator formed from second resistor 49, third resistor 50 and fifth switch 51.

The application of voltage to bias current source 33 changes the light generated by VCSEL diode 20 thereby affecting the flow of current through first resistor 36. In turn, this signal is coupled to the input of first amplifier 38 further adjusting the flow of current from bias current source 33. In this manner, the negative feedback loop formed by first amplifier 38, bias current source 33, and photodiode 35 operates to set the value of bias current source 33 so that the voltage across first resistor 36 is set substantially equal to the value of the first reference voltage. The term "substantially equal" as it is used within this specification means within the range of error voltage between the inverting and non-inverting inputs when first amplifier 38 is used within the negative feedback loop. The value of the first reference voltage is selected so that light power output generated by VCSEL diode 20 is significantly less than the light power output required for discharging the photoconductor. Typically, the value of the first reference voltage would be selected so that the bias current source 33 alone causes the VCSEL diode 20 to generate light power near 0.05 mW. At this level the value of bias current source 33 is a small amount above the current required for generating coherent laser light from VCSEL diode 20.

After the negative feedback loop operates to set the bias current source 33 so that the VCSEL diode generates approximately 0.05 mW, fifth switch 51 is closed 101 thereby reducing the voltage supplied to the control input of bias current source 33 from the condition in which fifth switch 51 is open because of the effect of the controllable attenuator formed by second resistor 49, third resistor 50, and fifth switch 51. The values of second resistor 49 and third resistor 50 are selected so that the controllable attenuator reduces the voltage supplied to the control input of bias current source 33 to a level at which the bias current source 33 alone is a small amount below the threshold for generating coherent laser light. After the adjustment of the bias current source 33 is complete, fourth switch 46 is opened 102 and fourth capacitor 47 holds its voltage until the performance of the next calibration operation upon bias current source 33.

Next, adjustment is performed on the drive current source 32. First, the LON signal is set at a high level 103 thereby closing sixth switch 54 is closed thereby causing the current from the compensation current source 31 and drive current source 32 to flow through VCSEL diode 20 in addition to the bias current. This results in the total current flow through VCSEL diode 20 exceeding the threshold level of current required for generating coherent laser light. Next, third switch 44 is closed 104 so that the output of second amplifier 39 is coupled to third capacitor 45. The light generated by VCSEL diode 20 causes current to flow through first resistor 36 thereby generating a signal fed through first unity gain buffer 37 to the inverting input of second amplifier 39. The output of second amplifier 39 charges third capacitor 45. With third switch 44 closed, a negative feedback loop is formed from drive current source 32, photodiode 35, and second amplifier 39. This negative feedback loop adjusts the value of drive current source 32 so that the laser light power generated by VCSEL diode 20 is sufficient to generate a voltage across first resistor 36 that is approximately equal to the value of the second reference voltage. This is accomplished by amplifying the difference between the voltages at the inverting and non-inverting inputs of the second amplifier 39 and using this value to control the drive current source 32. The value of the second reference voltage is selected so that drive current source 32 is adjusted to the value necessary to generate the nominal value of laser power from VCSEL diode 20 needed to discharge the photoconductor.

The LON signal is kept at a high level and third switch 44 is kept closed for at least five of the time constants required for the thermal stabilization of the laser output power from VCSEL diode 20. While the LON signal is at a high level, the output of inverting unity gain buffer 55 is at a low level. With the output of inverting unity gain buffer 55 at a low level, the voltage across time constant capacitor 56 decays to approximately zero after five time constants. Because the compensation current generated by compensation current source 31 is controlled by the voltage across time constant capacitor 56 (in addition to control by the voltage across third capacitor 45), when the voltage across time constant capacitor 56 decays to zero, the compensation current will also decay to zero. By applying current to VCSEL diode 20 for this period of time, the voltage controlling the drive current source is set at the value necessary to meet the nominal VCSEL diode output power required for discharging of the photoconductor under the condition that the compensating current has decayed to approximately zero and the VCSEL diode output power variation due to thermal effects has reached equilibrium.

After the negative feedback loop including drive current source 32 has set the value of the voltage on third capacitor 45, third switch 44 is opened 105. By opening third switch 44, the voltage on third capacitor 45 is held substantially constant until the next adjustment cycle.

Next, adjustment is performed on the compensation current source 31. It should be noted that the magnitude of the compensation current is proportional to the product of the voltage on second capacitor 43 and the voltage on time constant capacitor 56. The LON signal is set 106 to a low level. The LON signal is held low for at least five of the time constants required for the VCSEL diode 20 to cool so that the output power of VCSEL diode 20 reaches equilibrium. Setting the LON signal to a low level opens sixth switch 54. Then, the LON signal is set 107 to a high value closing the sixth switch 54 so that the drive current and compensation current flow through VCSEL diode 20. At substantially the same time that the LON signal is set to a high value, second switch 42 is closed 108 for a time that is small relative to the thermal time constant of VCSEL diode 20. A typical value of the period of time that second switch 42 is closed is a period of time no greater than one tenth of the time constant of the VCSEL diode 20 output power variation. Second amplifier 39 amplifies the difference between the second reference voltage and the voltage across first resistor 36. Second capacitor 43 is charged with this amplified voltage difference.

The voltage on second capacitor 43 adjusts the value of the compensation current generated by compensation current source 31. The negative feedback loop formed from photodiode 35, second amplifier 39, and compensation current source 31 adjusts the value of compensation current source 31 so that the value of the output power from VCSEL diode 20 is sufficient to generate a voltage across first resistor 36 approximately equal to the second reference voltage. The value of the output power of VCSEL diode 20 at this time has not been significantly increased by heating of VCSEL diode 20. The feedback loop adjusts the value on second capacitor 43 so that the sum of the compensating current and the drive current (previously adjusted by setting the voltage on third capacitor 45) set the output power from VCSEL diode 20 at the nominal power necessary for properly discharging the photoconductor before thermal effects begin to increase the output power of VCSEL diode 20. After the voltage on second capacitor 43 has been set to the necessary value, second switch 42 is opened 109.

Next, adjustment is performed on the time constant resistor 34. Time constant resistor 34 is a voltage controlled resistor. The adjustment of time constant resistor 34 is performed so that the time constant formed by time constant resistor 34 and time constant capacitor 56 matches that of the time constant of the thermal effect causing variation in the output power of VCSEL diode 20. It should be recognized that it would be possible to match the thermal time constant of VCSEL diode 20 by using a fixed value for time constant resistor 34 and a time constant capacitor 56 that has a voltage controlled capacitance. A varactor diode may be used for time constant capacitor 56. Varactor diodes have the characteristic that the capacitance across the PN junction of the diode is controlled by the reverse bias applied to the diode. There are a variety of circuit configurations which may be used to implement the function of time constant resistor 34. For example, using a voltage multiplier and a current source it is possible to form an element that behaves as a voltage controlled resistance.

To begin the adjustment of time constant resistor 34, the LON signal is set 110 at a low level for at least five of the VCSEL diode thermal time constants. Then, after approximately one VCSEL diode thermal time constant has passed, first switch 40 is closed 111 for a relatively short period of time not greater than a tenth of the thermal time constant of VCSEL diode 20. The negative feedback loop formed from time constant resistor 34, photodiode 35, and second amplifier 39 adjusts the voltage on first capacitor 41 so that the output power of VCSEL diode 20 is at the nominal level. The adjustment of the voltage on first capacitor 41 changes the value of time constant resistor 34 so that the compensation current is set a value that causes VCSEL diode 20 to output the nominal level of power. Next, first switch 40 is opened 112. In setting the value of time constant resistor 34 so that the output power of VCSEL diode 20 is at the nominal value, the voltage of first capacitor 41 is set so that the time constant formed by time constant resistor 34 and time constant capacitor 56 is somewhat less than the time constant of the thermal effect.

Next, the LON signal is set 113 at a low level for at least five of the VCSEL diode 20 thermal time constants. As a result of setting the LON signal at a low level, sixth switch 54 is opened and no drive current or compensation current flows through VCSEL diode 20. However bias current continues to flow through VCSEL diode 20. Holding the LON signal low for at least five thermal time constant provides sufficient time for the equilibration of the thermal effect on the output power of VCSEL diode 20. Then, the LON signal is set 114 at a high level. Then, after approximately one thermal time constant, first switch 40 is again closed 115 to begin another cycle of adjustment of the value of time constant resistor 34 using the negative feedback loop formed by time constant resistor 34. At the end of this adjustment cycle, the value of time constant resistor 34 set by the voltage on first capacitor 41 results in a value of the time constant formed by time constant capacitor 56 and time constant resistor 34 is somewhat greater than the time constant of the thermal effect. After performing successive cycles of the adjustment of time constant resistor 34 in this manner, the value of time constant resistor 34 will converge upon a value that approximates the time constant of the thermal effect. Typically, eight iterations of adjustment are required to approximate the time constant of the thermal effect so that the compensation is effective. However, it should be recognized, that depending upon the thermal time constant characteristics, a greater or lesser number of iterations may provide a sufficient approximation of the time constant of the thermal effect. After the multiple iterations required for adjustment of the time constant resistor 34 are complete, first switch 40 is opened thereby holding the voltage on first capacitor 41 substantially constant until the next calibration of first adjustment circuit embodiment 30.

An alternative implementation of the first adjustment circuit embodiment 30 could use an integrator in substitute for second amplifier 39. Use of an integrator results in a smaller steady state difference between the second reference voltage and the output of first unity gain buffer 37. This smaller steady state difference results in values of the bias current, the drive current, the compensation current, and the time constant resistor 34 so that the adjustment circuit is closer to fully compensating for the thermal effect of VCSEL diode 20.

In an electrophotographic printer, VCSEL diode 20 would be used within a laser scanner. The laser scanner sweeps the beam generated by VCSEL diode 20 across the surface of the photoconductor in the electrophotographic printer. Typically, the laser scanner includes a rotating polygonal mirror that sweeps the laser beam across the photoconductor. Associated with each pass of the laser beam across the drum there is a shorter period of time (typically about 30% of the sweep time) for which the polygonal mirror does not direct the laser beam to the surface of the photoconductor. The length of the thermal time constant of the VCSEL diode 20 is short enough so that this shorter period of time could be used for the calibration of the first adjustment circuit embodiment 30.

Figure 8:
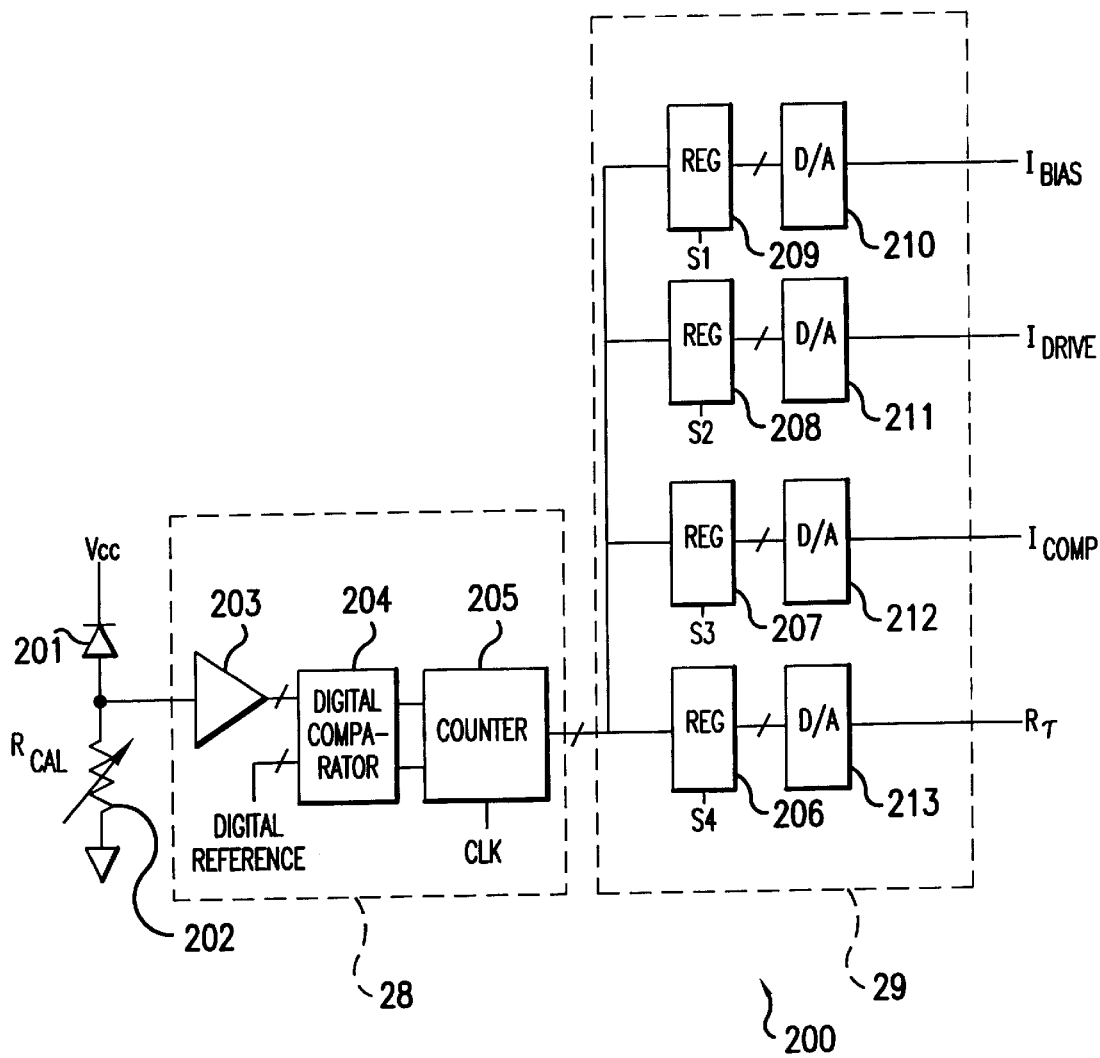
FIG. 8 is a simplified schematic of a second embodiment of the adjustment circuit.

Shown in FIG. 8 is a schematic of a second adjustment circuit embodiment 200. For simplicity of illustration, FIG. 8 does not show the hardware used to perform the compensation of the VCSEL diode output power. This hardware would be similar to the laser diode output power compensator shown in FIG. 6. The second adjustment circuit embodiment 200 is a digital implementation of a VCSEL diode adjustment circuit. Photodiode 201 generates a current as a result of incident laser light. The current generates a voltage across resistor 202. Analog to digital converter 203 generates a digital output value corresponding to the voltage across resistor 202 applied to the input of analog to digital converter 203.

A digital reference value and the output of analog to digital converter 203 are supplied to digital comparator 204. The digital reference value applied to digital comparator 204 corresponds, successively, to the value required to control the value of the bias current, the drive current, the compensation current and the value of time constant resistor 34. Digital comparator 204 compares the digital value supplied by analog to digital converter 203 to the digital reference value corresponding to the part of the compensation circuit undergoing adjustment. The digital comparator 204 includes an increment output and a decrement output each coupled to digital counter 205. The increment output of digital comparator 204 is coupled to an increment input on digital counter 205. The decrement output of digital comparator 204 is coupled to a decrement input on digital counter 205.

In FIG. 8, difference generator 28 is formed by analog to digital converter 203, digital comparator 204, and counter 205. Difference generator 28 takes the output signal from photodiode 201 and generates a plurality of control signals.

The output of digital counter 205 is coupled through a bus to each of a first register 206, a second register 207, a third register 208, and a fourth register 209. Each of the registers 206–209 includes an enable input to allow the output of digital counter 205 to be selectively loaded into the one of registers 206–209 corresponding to the element of the laser diode output power compensator undergoing adjustment.

The digital output of each of the first 206, the second 207, the third 208, and the fourth 209 registers is coupled to a corresponding first 210, second 211, third 212, and fourth 213 digital to analog converter. The outputs of each of digital to analog converters 210–213 is coupled to the corresponding control inputs of one of the bias current source 33, drive current source 32, compensation current source 31, and time constant resistor 34, as indicated by the labels shown in FIG. 8. In FIG. 8, registers 206–209 and digital to analog converters 210–213 form the plurality of storage elements for storing the plurality of control signals generated by difference generator 28.

Figure 9A:
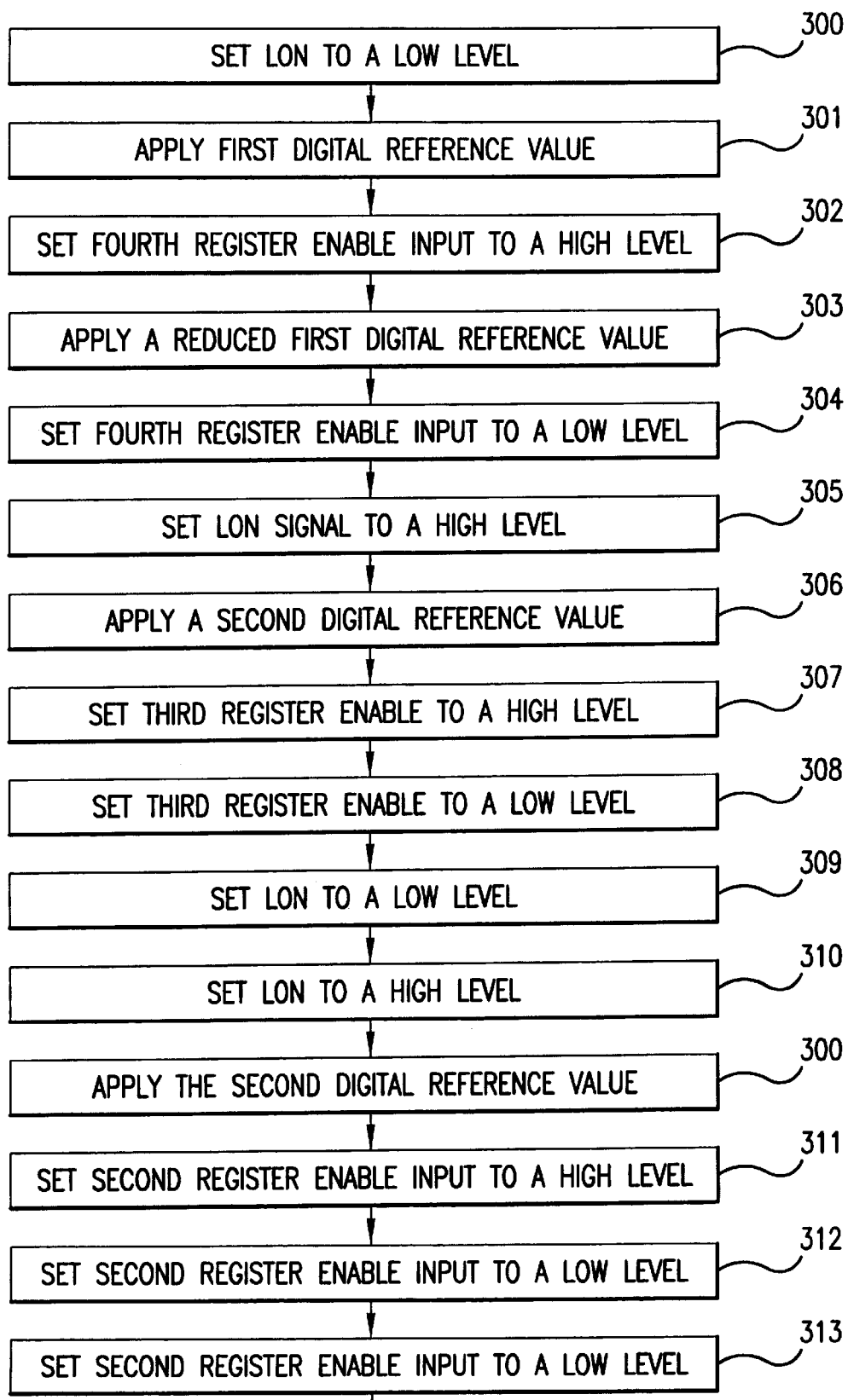
FIG. 9 is a simplified flow chart of a method for using the second embodiment of the adjustment circuit.
Figure 9B:
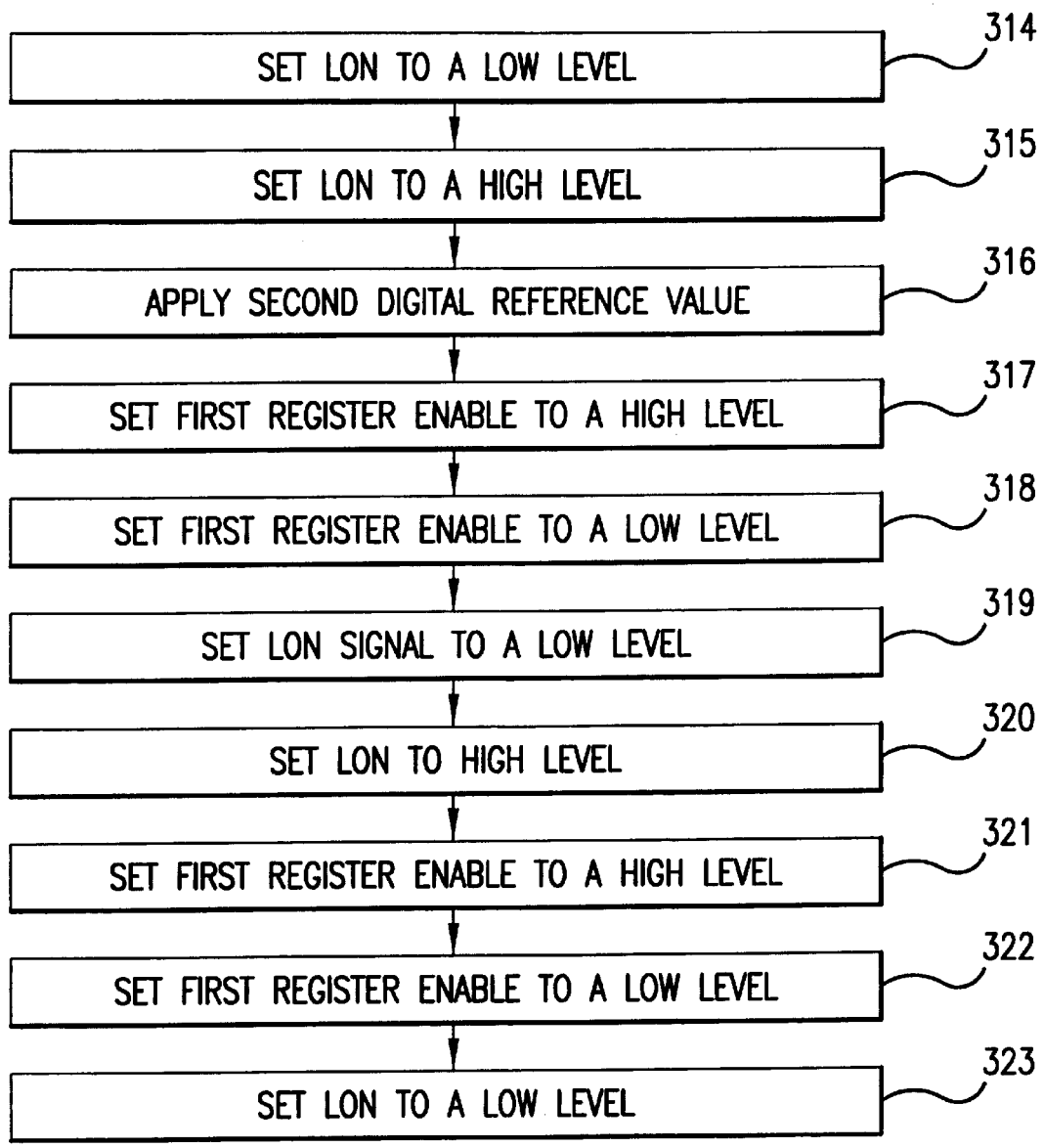

Shown in FIG. 9 is a flow chart of a method for using the second adjustment circuit embodiment 200 to accomplish automatic adjustment of the laser diode output power compensator. The steps performed in the automatic adjustment of the laser diode output power compensator are similar to those involved for the automatic adjustment of the first adjustment circuit embodiment 30. As was the case for the first adjustment circuit embodiment 30, adjustment of resistor 202 is done manually so that there is a known relationship between the output power of VCSEL diode 20 and the voltage across resistor 202.

First the LON signal is set 300 to a low value so that sixth switch 54 is open and no drive current or compensation current flows through VCSEL diode 20. Next, a first digital reference value is applied 301 to one of the inputs of digital comparator 204. The first digital reference value corresponds to the value necessary to set the output power of VCSEL diode 20 to a value much less than the power value required for discharge of the photoconductor. A typical value is 0.05 mw. Next, at substantially the same time, the enable input of fourth register 209 is set 302 to a high level. The negative feedback loop formed by bias current source 33, photodiode 201, and digital comparator 204 adjusts the output power VCSEL diode 20 so that the output of analog to digital convertor 203 is equal to the first digital reference value. Next, the value of the first digital reference value is reduced by a predetermined amount and applied 303 to the input of digital comparator 204. Through the operation of the negative feedback loop, the reduced first digital reference value lowers the value of bias current source 33 to a level below that required for generating coherent laser light. This occurs by causing digital comparator 204 to decrement digital counter 205 so that the value in fourth register 209 is set at a level necessary to reduce bias current source 33 below the lasing threshold. After this adjustment operation, the enable input of fourth register 209 is set 304 to a low level so that the value in fourth register 209 remains constant until the next adjustment of bias current source 33.

Adjustment of the drive current source 32 is then performed. The LON signal is set 305 at a high level. This causes sixth switch 54 to close and allow drive current and compensation current to flow through VCSEL diode 20 in addition to the bias current. Next, a second digital reference value is applied 306 to the input of digital comparator 204. The second digital reference value is that necessary to set the output power of VCSEL diode 20 at the nominal level required for discharging the photoconductor during printing. Then, at substantially the same time, the enable input of third register 208 is set 307 at a high level. The operation of the negative feedback loop results in third register 208 having a value necessary to set the drive current source 32 at a value that results in nominal output power from VCSEL diode 20. The enable input for third register 208 is held at a high level for a sufficient period of time until the thermal effect on the output power of VCSEL diode 20 comes to equilibrium. At this time, the value of compensation current source 31 is approximately zero and drive current source is set to a value necessary to generate nominal output power from VCSEL diode 20. Then, the enable input of third register 208 is set 308 to a low level so that the value in third register is held constant until the next adjustment cycle.

The magnitude of the compensation current source 31 is adjusted next. The LON signal is set 309 at a low level for at least five time constants of the VCSEL diode 20 thermal effect. Sixth switch 54 opens so that the drive current and the compensation current no longer flow through VCSEL diode 20. This ensures that the VCSEL diode 20 will have cooled sufficiently to reach equilibrium with only bias current flowing through it. Next, the LON signal is set 310 at a high level so that sixth switch 54 is closed and the drive current and bias current flow through VCSEL diode 20. Next, the second digital value is applied 311 to the input of digital comparator 204. Substantially simultaneously, the enable input of second register 207 is set 312 at a high value to allow the negative feedback loop to adjust the value in second register 207 so that the sum of the compensation current, drive current and bias current flowing through VCSEL diode 20 set its output power at the nominal value. The value in the second register 207 is set before the thermal effect begins to increase the power output of VCSEL diode 20. Therefore the value loaded into second register 207 will set the peak amplitude of the compensation current. After sufficient time has passed (sufficient time is much less than the VCSEL diode thermal time constant) for the negative feedback loop to adjust the value in second register 207, the enable input is set 313 at a low level. This holds the value in second register 207 until the next adjustment cycle. Next the LON signal is set 314 at a low level, thereby opening sixth switch 54 and allowing VCSEL diode 20 to return to thermal equilibrium with only bias current flowing through VCSEL diode 20.

The adjustment of time constant resistor 34 is performed next. The LON signal is set 315 to a high level. This causes sixth switch 54 to close and drive and compensation current begin to flow through VCSEL diode 20. Next, second digital value is applied 316 to the input of digital comparator 204. After approximately a single thermal effect time constant, the enable signal to first register is set 317 at a high level, thereby allowing the negative feedback loop to adjust the value in first register 206 so that the value of time constant resistor 34 is set at a value that results in nominal output power from VCSEL diode 20. After less than one tenth of a thermal effect time constant has passed, the enable input of first register 206 is set 318 to a low level, thereby holding the value in first register 206. Next the LON signal is set 319 at a low value. The value of time constant resistor 34 at this point results in a time constant less than the thermal effect time constant.

After at least five thermal effect time constants, the LON signal is set 320 at a high level. After approximately a single thermal effect time constant, the enable signal to first register 206 is set 321 to a high level to allow the negative feedback loop to adjust the value in first register 206 to the value necessary to set time constant resistor 34 so that VCSEL diode 20 generates nominal output power. After the enable signal is at a high level for less than one tenth of a thermal effect time constant, the enable signal is set 322 to a low level. This holds the value in first register 206 until the next calibration cycle is performed upon the second adjustment circuit embodiment 200. At substantially the same time, the LON signal is set 323 to a low value so that the sixth switch opens, thereby preventing drive current and compensation current from flowing through VCSEL diode 20 and allowing decay of the thermal effect time constant. This adjustment process for time constant resistor 34 is successively repeated until the value of time constant resistor 34 converges to the value so that the time constant formed by time constant capacitor 56 and time constant resistor 34 matches the thermal effect time constant.

Figure 10:
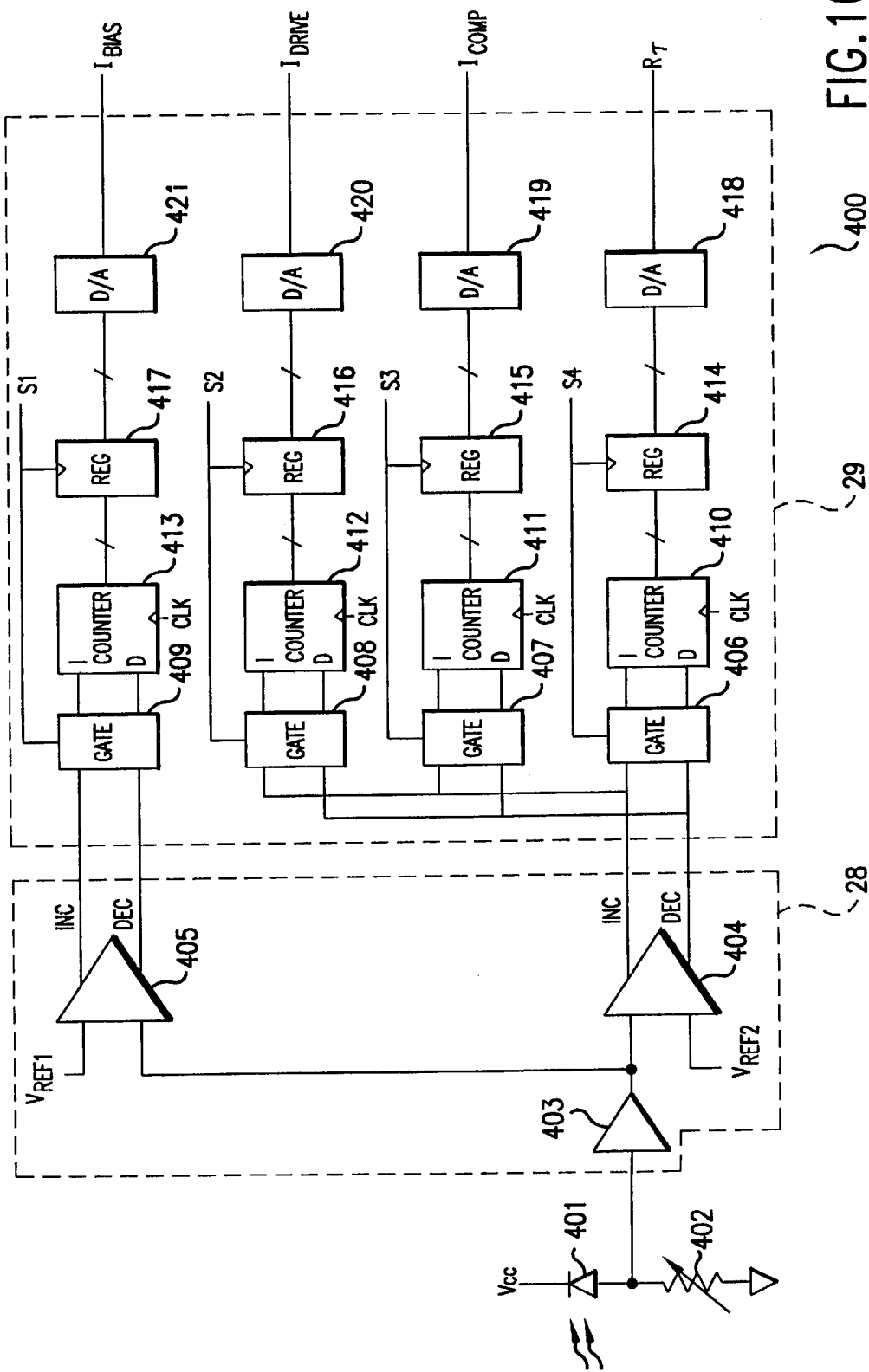
FIG. 10 is a simplified schematic of a third embodiment of the adjustment circuit.

Show in FIG. 10 is a simplified schematic of a third adjustment circuit embodiment 400. For simplicity of illustration, FIG. 10 does not show the hardware used to perform the compensation of the VCSEL diode output power. This hardware would be similar to the laser diode output power compensator shown in FIG. 6.

The third adjustment circuit embodiment 400 is a mixed analog and digital implementation. Photodiode 401 generates a current as a result of incident laser light. The current generates a voltage across resistor 402. The voltage across resistor 402 is buffered by unity gain buffer 403. First 404 and second 405 analog comparators each have an input coupled to the output of unity gain buffer 403. First 404 and second 405 analog comparators are used to compare the output signal of photodiode 401 to a first and a second reference voltage. The first and second reference voltages are coupled to one of the two inputs of, respectively, the first 404 and second 405 analog comparators.

In FIG. 10, difference generator 28 is formed by unity gain buffer 403, first analog comparator 404, and second analog comparator 405. Difference generator 28 takes the output signal from photodiode 401 and generates a plurality of control signals.

Each of first 404 and second 405 analog comparators includes a first and a second output. The first and second outputs are coupled to the inputs of a first 406, a second 407, a third 408, and a fourth 409 gate. The gates control the application of the outputs of the first 404 and second 405 analog comparators to the respective ones of the first 410, second 411, third 412, and fourth 413 digital counters. The outputs of each of the first 410, second 411, third 412, and fourth 413 digital counters are coupled, respectively, to the first 414, second 415, third 416, and fourth 17 registers. The output of each of the first 414, second 415, third 416, and fourth 17 registers are coupled to the corresponding one of the first 418, second 419, third 420, and fourth 421 digital to analog converters. In FIG. 10, gates 406–409, digital counters 410–413, registers 414–417, and digital to analog converters 418–421 form the plurality of storage elements 29 for storing the plurality of control signals generated by difference generator 28. As shown in FIG. 10 the outputs of each of the digital to analog converters is coupled to one of the elements of the laser diode output power compensator that requires adjustment.

The operation of the third adjustment circuit embodiment 400 to perform adjustment of the laser diode output power compensator is similar to that of the second adjust circuit embodiment 200. The two outputs of first 404 and second 405 analog comparators are used to control the incrementing and decrementing of each of the respective digital counters 410–413. The gates 406–409 are used to control the application of the outputs of first 404 and second 405 analog comparators. The bias current source 33, drive current source 32, compensation current source 31, and time constant resistor 34 are successively adjusted using the third adjustment circuit embodiment 400.

During the adjustment process each one of the sets of gates, counters, and registers used for adjusting one of the corresponding elements of the laser diode output power compensator. The negative feedback loop adjusts the value in the register corresponding to the element undergoing adjustment so that the voltage at the output of unit gain buffer 403 is substantially equal the voltage reference value input to the corresponding analog comparator. This is accomplished by incrementing or decrementing the digital counter used for the adjustment in response to the outputs of corresponding analog comparator. In turn, the outputs of the corresponding analog comparator are determined by whether the output of the unity gain buffer is lager or smaller that the reference voltage. In this manner, the values in the registers are set to the values necessary for the compensation of the thermal effect in VCSEL diode 20.

Each of the disclosed embodiments of the adjustment circuits may be implemented in an integrated circuit. The preferred implementation of the embodiments of the adjustment circuit are fabricated (with the exception of the photodiode and its associated resistor) on an integrated circuit. However, it should be recognized that discrete components may be used to implement the embodiments of the adjustment circuits.

As previously mentioned, the disclosed techniques for adjusting the laser diode output power compensator could be used with multiple laser diodes in an electrophotographic printer. With adjustments performed on multiple laser diode output power compensators, the time available for adjusting each of the laser diode output power compensators is reduced to a fraction of the total time during a scan of the laser scanner over the photoconductor for which the laser beam is not on the surface of the photoconductor. However, if the time available between scans over the photoconductor is not sufficient to perform adjustments on all of the laser diodes, then adjustment may be performed between subsequent scans.

Although several embodiments of the invention have been illustrated, and their forms described, it is readily apparent to those of ordinary skill in the art that various modifications may be made therein without departing from the spirit of the invention or from the scope of the appended claims.

What is claimed is:

1. A method for adjusting a time constant circuit in a laser power control circuit, comprising:

applying a bias current to a laser diode for a time sufficient to substantially reach thermal equilibrium in the laser diode;

applying a drive current and a compensation current to the laser diode;

measuring light emitted from the laser diode;

generating a signal based upon measuring the light emitted;

forming a difference signal using the signal and a predetermined value; and changing a time constant of the time constant circuit to set the light emitted substantially equal to a predetermined intensity using the difference signal.

2. The method as recited in claim 1, further comprising:

storing a value related to the difference signal after changing the time constant; and removing the drive current and the compensation current from the laser diode after a time substantially equal to a thermal time constant of the laser diode.

3. The method as recited in claim 2, further wherein:

storing the value includes storing the value in a storage element coupled to the time constant circuit; and changing the time constant includes changing a resistance value in the time constant circuit.

4. The method as recited in claim 3, wherein:

forming the difference signal includes applying the signal and the predetermined value to inputs of an amplifier;

storing the value in the storage element includes charging a capacitor using the difference signal;

applying the drive current and the compensation current includes actuating a first switch to couple the amplifier to the capacitor and a second switch to couple a drive current source and a compensation current source to the laser diode; and removing the drive current and the compensation current includes actuating the first switch to decouple the amplifier from the capacitor and the second switch to decouple the drive current source and the compensation current source from the laser diode.

5. The method as recited in claim 4, wherein:

the time sufficient to substantially reach thermal equilibrium equals at least five of the thermal time constant.

6. The method as recited in claim 3, wherein:

forming a difference signal includes applying the signal to an analog to digital converter to form a digital signal, comparing the digital signal to a digital reference value to generate an increment signal or a decrement signal, and applying the increment signal or the decrement signal to a counter to generate a count; and storing the value in the storage element includes storing the count in a register.

7. The method as recited in claim 3, wherein:

forming a difference signal includes applying the signal to an analog comparator to generate an increment signal or a decrement signal and applying the increment signal or the decrement signal to a counter to generate a count; and storing the value in the storage element includes storing the count in a register.

8. A method for adjusting a drive current source in a laser power control circuit, comprising:

applying a drive current, a bias current, and a compensation current to a laser diode for a time sufficient to substantially reach thermal equilibrium in the laser diode and to allow the compensation current to decay to substantially zero;

measuring light emitted from the laser diode;

generating a signal based upon measuring the light emitted;

forming a difference signal using the signal and a predetermined value;

changing the drive current to set the light emitted substantially equal to a predetermined intensity using the difference signal; and storing a value related to the difference signal.

9. The method as recited in claim 8, wherein:

storing the value includes storing the value in a storage element coupled to the drive current source.

10. The method as recited in claim 9, wherein:

forming a difference signal includes applying the signal and the predetermined value to inputs of an amplifier; and storing the value in the storage element includes charging a capacitor using the difference signal.

11. The method as recited in claim 9, wherein:

forming a difference signal includes applying the signal to an analog to digital converter to form a digital signal, comparing the digital signal to a digital reference value to generate an increment signal or a decrement signal, and applying the increment signal or the decrement signal to a counter to generate a count; and storing the value in the storage element includes storing the count in a register.

12. The method as recited in claim 9, wherein:

forming a difference signal includes applying the signal to an analog comparator to generate an increment signal or a decrement signal and applying the increment signal or the decrement signal to a counter to generate a count; and storing the value in the storage element includes storing the count in a register.

13. A method for adjusting a compensation current source in a laser power control circuit, comprising:

applying a bias current to a laser diode for a time sufficient to substantially reach thermal equilibrium in the laser diode and sufficient for the compensation current source to substantially reach an initial condition;

applying a drive current and a compensation current to the laser diode for less than or equal to a predetermined fraction of a thermal time constant of the laser diode;

measuring light emitted from the laser diode;

generating a signal based upon measuring the light emitted;

forming a difference signal using the signal and a predetermined value;

changing the compensation current to set the light emitted substantially equal to a predetermined intensity using the difference signal; and storing a value related to the difference signal.

14. The method as recited in claim 13, wherein:

storing the value includes storing the value in a storage element coupled to the compensation current source.

15. The method as recited in claim 14, wherein:

the predetermined fraction of the thermal time constant includes a value less than or equal to a tenth of the thermal time constant; and the time includes a greater of five of the thermal time constant and five of a time constant of the compensation current.

16. The method as recited in claim 15, wherein:

forming a difference signal includes applying the signal and the predetermined value to inputs of an amplifier; and storing the value in the storage element includes charging a capacitor using the difference signal.

17. The method as recited in claim 16, wherein:

applying the drive current and the compensation current includes actuating a first switch to couple the amplifier to the capacitor and a second switch to couple a drive current source and the compensation current source to the laser diode.

18. The method as recited in claim 15, wherein:

forming a difference signal includes applying the signal to an analog to digital converter to form a digital signal, comparing the digital signal to a digital reference value to generate an increment signal or a decrement signal, and applying the increment signal or the decrement signal to a counter to generate a count; and storing the value in the storage element includes storing the count in a register.

19. The method as recited in claim 18, wherein:

applying the drive current and the compensation current includes actuating a switch to couple a drive current source and the compensation current source to the laser diode.

20. The method as recited in claim 15, wherein:

forming a difference signal includes applying the signal to an analog comparator to generate an increment signal or a decrement signal and applying the increment signal or the decrement signal to a counter to generate a count; and storing the value in the storage element includes storing the count in a register.

21. The method as recited in claim 20, wherein:

applying the drive current and the compensation current includes actuating a switch to couple a drive current source and the compensation current source to the laser diode.

* * * * *